United States Patent [19]

Seyyedy et al.

[11] Patent Number: 5,684,749
[45] Date of Patent: *Nov. 4, 1997

[54] SINGLE-ENDED SENSING USING GLOBAL BIT LINES FOR DRAM

[75] Inventors: Mirmajid Seyyedy; Stephen L. Casper, both of Boise, Id.

[73] Assignee: Micron Technology, Inc., Boise, Id.

[*] Notice: The term of this patent shall not extend beyond the expiration date of Pat. No. 5,625,588.

[21] Appl. No.: 707,867

[22] Filed: Sep. 9, 1996

Related U.S. Application Data

[63] Continuation of Ser. No. 471,860, Jun. 6, 1995, Pat. No. 5,625,588.
[51] Int. Cl.⁶ .................................................. G11C 7/00
[52] U.S. Cl. ........................................ 365/203; 365/149
[58] Field of Search ............................ 365/203, 149, 365/204, 202

[56] References Cited

U.S. PATENT DOCUMENTS

| | | | |
|---|---|---|---|
| 4,715,015 | 12/1987 | Mimoto et al. | 365/149 |
| 5,241,503 | 8/1993 | Cheng | 365/149 |
| 5,309,392 | 5/1994 | Ootsuka | 365/149 |
| 5,367,481 | 11/1994 | Takase et al. | 365/149 |

*Primary Examiner*—Tan T. Nguyen
*Attorney, Agent, or Firm*—Schwegman, Lundberg, Woessner & Kluth

[57] ABSTRACT

An integrated circuit dynamic memory device is described which stores data in memory cells as a charge on a capacitor. The memory cells can be selectively connected to a digit line. Sensing circuitry, including both p-sense and n-sense amplifiers, is connected to the digit line for sensing data stored in the memory cells. Equalization circuitry is described to equalize the sense amplifiers by connecting both nodes of the sense amplifiers to the digit line prior to sensing data stored on the memory cell.

15 Claims, 6 Drawing Sheets

FIG. 2A  EQ
FIG. 2B  ISO A
FIG. 2C  ISO B
FIG. 2D  WORD LINE 108
FIG. 2E  DIGIT LINES
FIG. 4A  ISO EQUIL
FIG. 4B  EQ
FIG. 4C  ISO DIGIT
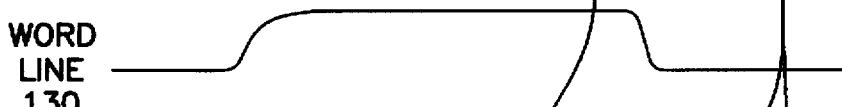
FIG. 4D  WORD LINE 130
FIG. 4E  SENSE AMP NODES
FIG. 4F  DIGIT LINE 124
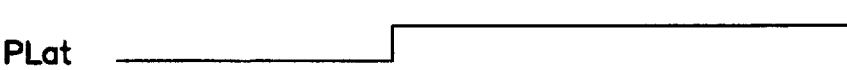
FIG. 4G  PLat
FIG. 4H  NLat FIG. 5A EQ 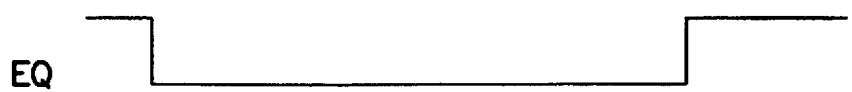
FIG. 5B ISO DIGIT 
FIG. 5C WORD LINE 
FIG. 5D ISO EQUIL 
FIG. 5E PLat 
FIG. 5F NLat 
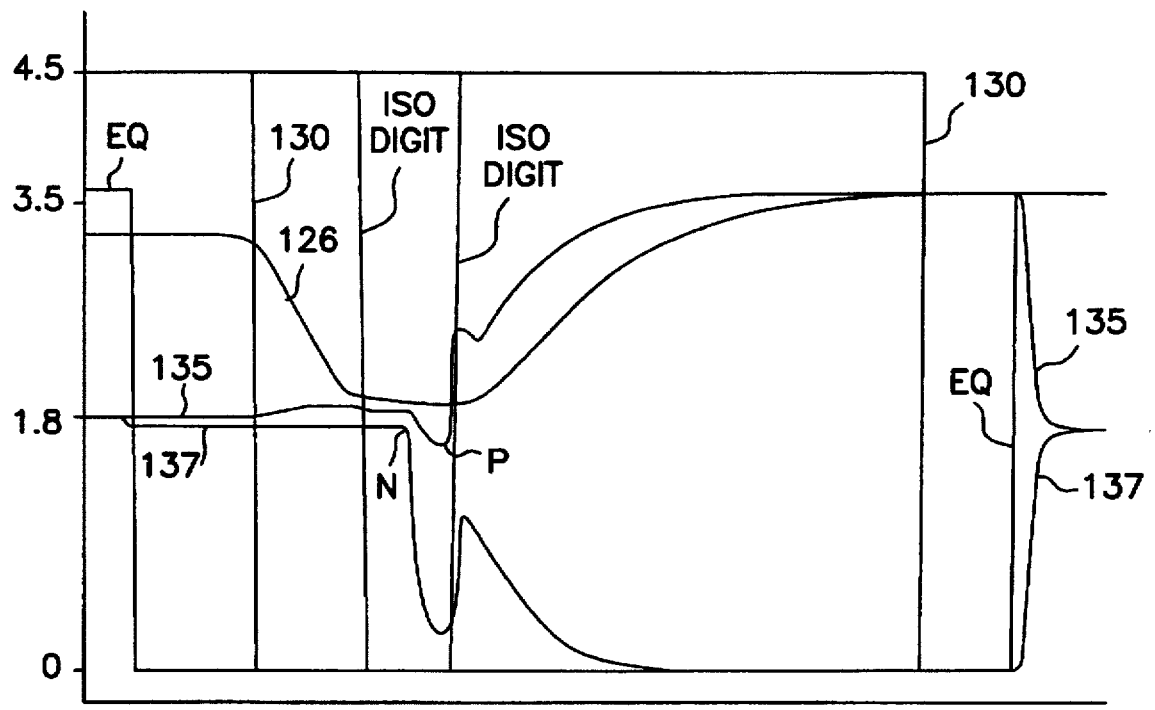
FIG. 6

SINGLE-ENDED SENSING USING GLOBAL BIT LINES FOR DRAM

This is a continuation of application Ser. No. 08/471,860, filed Jun. 6, 1995 now U.S. Pat. No. 5,625,588.

TECHNICAL FIELD OF THE INVENTION

The present invention relates generally to dynamic memory integrated circuits and in particular the present invention relates to sensing circuits therein.

BACKGROUND OF THE INVENTION

Integrated circuit memories have become increasingly dense as the need for more memory storage increases. While fabrication techniques and design options have been fairly successful in maintaining steady increases in memory storage from design generation to generation, the need for new highly populated circuits continues.

A dynamic random access memory (DRAM) device is comprised of an arrangement of individual memory cells. Each memory cell comprises a capacitor capable of holding a charge and an access transistor for accessing the capacitor charge. The charge is referred to as a data bit and can be either a high voltage or a low voltage. Data can be either stored in the memory cells during a write mode, or data may be retrieved from the memory cells during a read mode. The data is transmitted on signal lines, referred to as bit or digit lines, which are coupled to input/output lines through transistors used as switching devices. For each bit of data stored, its true logic state is available on an I/O line and its complementary logic state is available at on an I/O compliment line. Thus, each memory cell has two digit lines, digit and digit complement.

Typically, the memory cells are arranged in an array and each cell has an address identifying its location in the array. The array comprises a configuration of intersecting rows and a memory cell is associated with each intersection. In order to read from or write to a cell, the particular cell in question must be selected, or addressed. The address for the selected cell is represented by input signals to a row decoder and to a column decoder. The row decoder activates a word line in response to the row address. The selected word line activates the access transistors for each of the memory cells in communication with the selected word line. The column decoder selects a digit line pair in response to the column address. For a read operation the selected word line activates the access transistors for a given row address, and data is latched to the digit line pairs.

Conventional dynamic memories use memory cells fabricated as capacitors in an integrated circuit to store data. That is, a logical "1" is stored as a charge on the capacitor and the capacitor is discharged for a logical "0". The pairs of digit lines are fabricated as metal lines on the integrated circuit and connected to the memory cells for transmitting data stored in the memory cells. Sense amplifiers are utilized to sense small differentials on the digit lines and drive the digit lines to full power supply rails for either reading the memory cells or writing thereto. Although unique fabrication techniques and processes have been developed to reduce the size of the memory cells and access circuitry, the physical spacing requirements for the digit line architecture creates a barrier to maximizing the available die area. That is, the reductions in memory cell size cannot be fully exploited due to the digit line pairs.

For the reasons stated above, and for other reasons stated below which will become apparent to those skilled in the art upon reading and understanding the present specification, there is a need in the art for a sensing circuitry which reduces the need for die area, thereby allowing for more densely populated memories.

SUMMARY OF THE INVENTION

The above mentioned problems with increasing the population of integrated circuit memories and other problems are addressed by the present invention and which will be understood by reading and studying the following specification. A dynamic memory circuit is described which uses sensing circuitry that reduces the number of metal digit lines needed to access the memory cells.

In particular, the present invention describes an integrated circuit which comprises an integrated circuit having a plurality of memory cell capacitors, a plurality of access devices connected to the plurality of memory cell capacitors and a digit line, each for selectively connecting one of the plurality of memory cell capacitors to the digit line, and a sense amplifier circuit having first and second nodes each selectively connected to the digit line.

The integrated circuit can further comprise an isolation circuit electrically located between the first node of the sense amplifier circuit and the digit line for selectively connecting the first node to the digit line. An isolation circuit can also be electrically located between the second node of the sense amplifier circuit and the digit line for selectively connecting the second node to the digit line.

In one embodiment the integrated circuit comprises an equilibrate circuit for equilibrating the sense amplifier circuit. This equilibrate circuit can comprise a transistor having its source connected to the first node and its drain connected to a second node of the sense amplifier circuit.

In an alternate embodiment, a dynamic memory integrated circuit comprises a plurality of memory cell capacitors, a plurality of access devices connected to the plurality of memory cell capacitors and a digit line, each for selectively connecting one of the plurality of memory cell capacitors to the digit line. A sense amplifier is provided having first and second nodes. A first isolation circuit is electrically located between the first node of the sense amplifier and the digit line for selectively isolating the first node from the digit line, and a second isolation circuit is electrically located between the second node of the sense amplifier and the digit line for selectively isolating the second node from the digit line.

In still another embodiment, a method of sensing data stored in a plurality of dynamic memory cell capacitors is described. The method comprises the steps of equilibrating a sense amplifier circuit having a first node and a second node selectively connected to a digit line, electrically isolating the second node of the sense amplifier circuit, and sensing the data stored in a dynamic memory cell capacitor. The step of sensing the data stored in the dynamic memory cell capacitor can comprise the steps of selectively connecting a dynamic memory cell capacitor to the digit line, electrically isolating the first node of the sense amplifier circuit from the digit line, and using the sense amplifier circuit, sensing a differential voltage between the first node and the second node. Additionally, the step of equilibrating the sense amplifier circuit can comprise the steps of electrically isolating the first node of the sense amplifier circuit from the digit line, selectively connecting the second node to the digit line, and activating a transistor having its source connected to the first node and its drain connected to the second node.

BRIEF DESCRIPTION OF THE DRAWINGS

FIGS. 2A–2E are a timing diagram of the sensing circuit of FIG. 1;

FIGS. 4A–4H are a timing diagram of the circuit in FIG. 3;

FIGS. 5A–5F are an alternate timing diagram of the circuit in FIG. 3;

FIG. 6 is a detailed diagram of a sensing and equilibration operation;

DETAILED DESCRIPTION OF THE INVENTION

In the following detailed description of the preferred embodiment, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1:
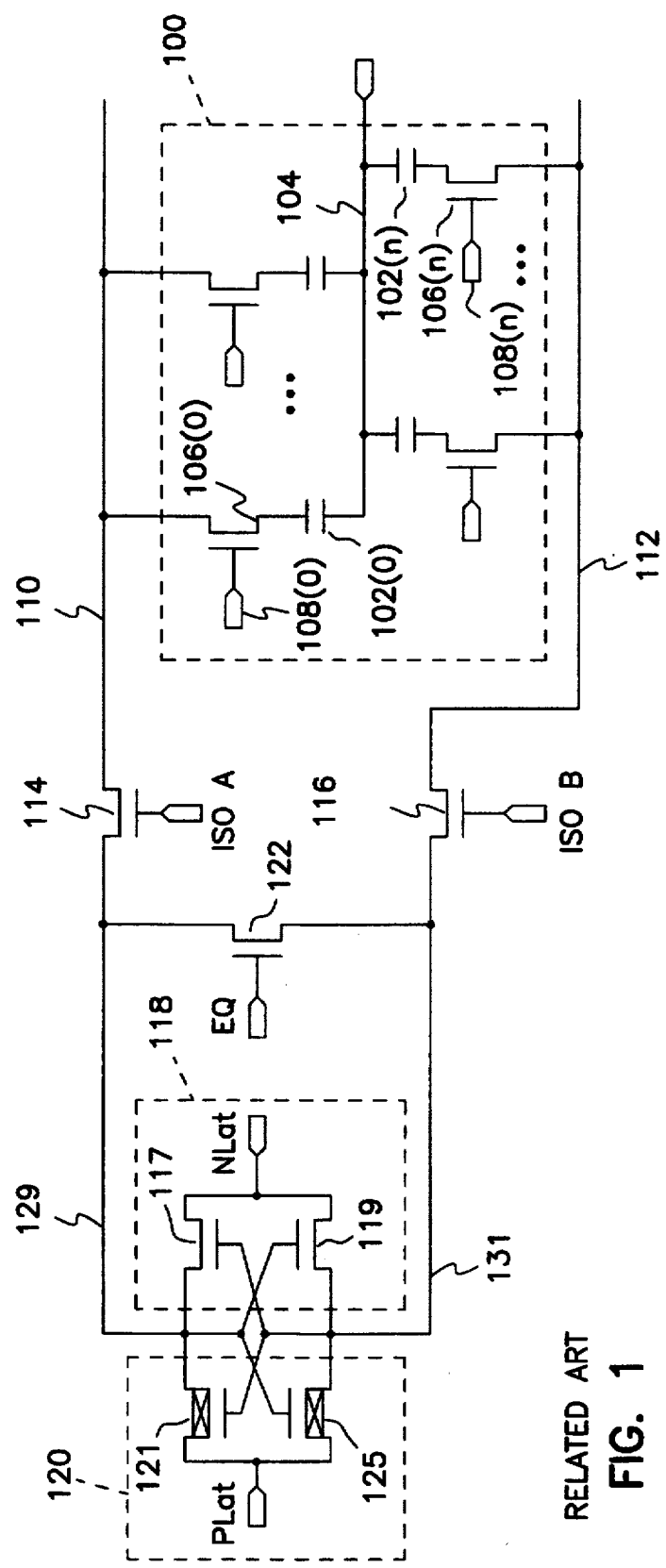
FIG. 1 is a schematic of a related memory sensing circuit.

Referring to FIG. 1, a portion of a conventional dynamic memory access circuitry is described. A memory array 100 has a plurality of memory cells 102(0)–(n) which are fabricated as capacitors having one capacitive plate formed as a common cell plate 104 and the other node connected to an access transistor 106(0)–(n). Each access transistor is a n-type transistor having its gate connected to a word line 108(0)–(n). The cell plate 104 is typically biased to one-half the power supply voltage (Vcc) by a biasing source (not shown).

Digit lines 110 and 112 are each connected to some of the access transistors and memory cells. When access transistors 106 are selectively activated, the charge stored on the corresponding memory cell 102 is coupled to one of the digit lines. N-type isolation transistors 114 and 116 are used to isolate digit lines 110 and 112, respectively, from both the n-sense amp 118 and the p-sense amp 120. Equilibrate transistor 122 is used to equalize the nodes of the sense amps to the same voltage, as described below.

In operation, data stored in the memory cells can be accessed and sensed following the process shown in FIG. 2. The first step is to equilibrate nodes 129 and 131 of sense amps 118 and 120 to Vcc/2, as sourced by a biasing circuit (not shown), by holding the gate of transistor 122 (EQ) high. The differential voltage across the sense amps is therefore zero with each node having a preferred voltage of one-half the supply voltage (Vcc). The next step is to activate isolation transistors 114 and 116 by providing their gates (ISO A and ISO B, respectively) with a high voltage. This connects the digit lines 110 and 112 to the sense amps 118 and 120 and allows the digit lines to also stabilize to Vcc/2. One of the memory cell access transistors 106(0)–(n) is then selectively activated by raising the associated word line 108(0)–(n) gate voltage. The charge, or lack of charge, stored on the selected memory cell 102 is then shared with one of the digit lines. If a logical "one" is stored on the capacitor the associated digit line will be slightly raised, for example by a voltage of approximately 100 mv. It will be understood that the charge shared with the digit line is directly dependant upon the charge stored on the memory cell. If the memory cell is un-charged the digit line voltage will drop, for example by 100 mv.

The n-sense amp 118 and the p-sense amp 120, as known to one skilled in the art, sense a differential between the digit lines and drive the digit lines to full rails in response. N-sense amp 118 has two n-channel transistors having their gates cross-coupled to the source of the other transistor. The drains of each transistor are connected together and controlled by an NLat line. The NLat line is typically pre-charged to the same level that nodes 129 and 131 have been equalized to, Vcc/2. The voltage on the NLat line is lowered to sense a high voltage on one of the nodes. Assuming for example that node 129 is 100 mv above node 131, transistor 119 will begin to turn on when the NLat drops by a threshold voltage below node 129. Node 131 will then be pulled to NLat to insure that transistor 117 does not turn on. Similarly, p-sense amp 120 has two cross-coupled p-channel transistors 121 and 125. The drains of each transistor are connected together and controlled by a PLat line. The PLat line is typically pre-charged to the same level that nodes 129 and 131 have been equalized to, Vcc/2. The voltage on the PLat line is raised to sense a low voltage on one of the nodes. Assuming for example that node 131 is 100 mv below node 129, transistor 121 will begin to turn on when the PLat increases by a threshold voltage above node 131. Node 129 will then be pulled to PLat to insure that transistor 125 does not turn on. The NLat and PLat are strobed to full power rails, ground and Vcc, respectively. If one of the digit lines is higher, therefore, that digit line will be driven to Vcc while the complementary digit line is pulled to ground.

As seen in FIG. 2, the voltage on the digit lines are equal until shortly after the word line is activated. The n-sense amp is strobed first to drive one line low and then the p-sense amp is strobed to drive the other line high. The digit lines remain latched at these full power levels until the equilibrate transistor 122 is again activated. During the time in which the word line is high and the digit lines are latched, the memory cell is refreshed.

Figure 3:
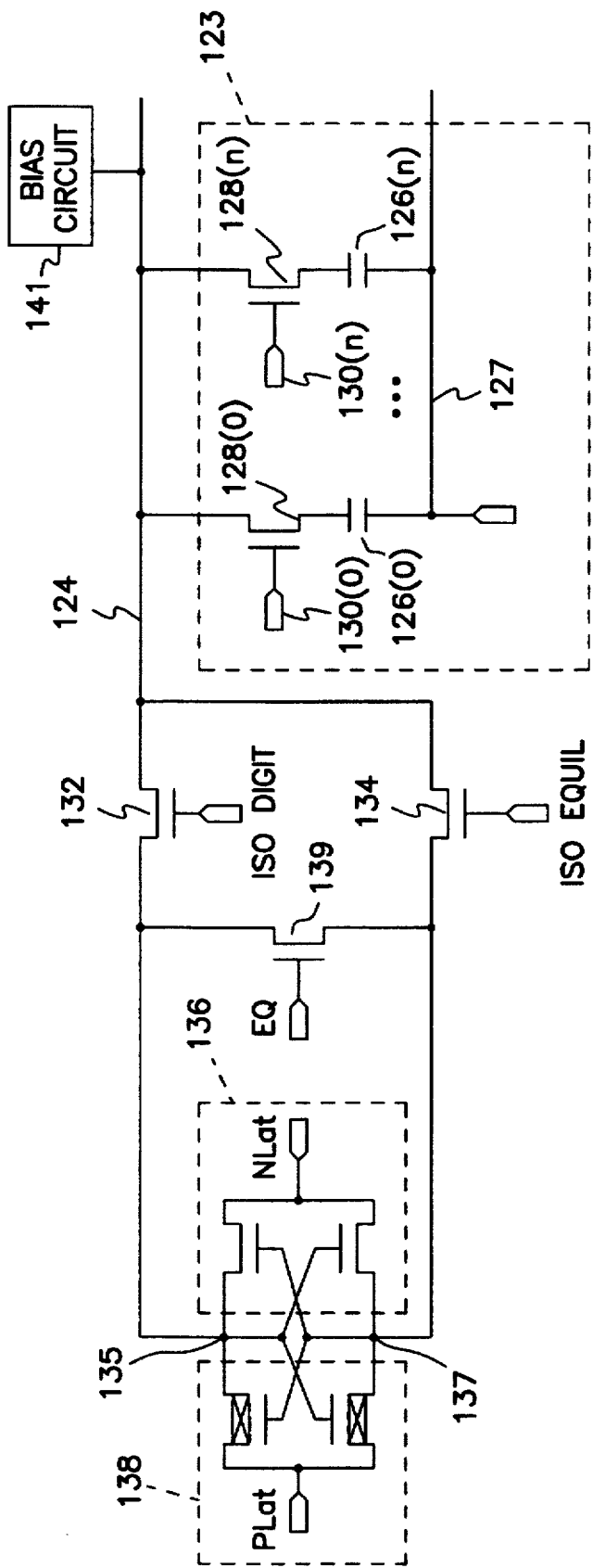
FIG. 3 is a schematic of a sensing circuit of the present invention.

As stated above, the digit lines are fabricated as metal lines which require a relatively large commitment of die area and create a barrier to increasing the density of a memory device. It would be beneficial, therefore, to reduce the number of digit lines. FIG. 3 illustrates a sensing circuit of the present invention. A memory array 123 is comprised of memory cells 126(0)–(n) fabricated as capacitors with one node connected to a common cell plate 127. The cell plate is biased to one-half Vcc by a biasing circuit (not shown). The other plate of each memory cell 126 is connected to one of the n-type access transistors 128(0)–(n). The access transistors are connected to digit line 124 and have their gate connected one of the word lines 130(0)–(n). Isolation transistor 132 is provided to selectively isolate digit line 124 from node 135 of both the n-sense amp 136 and the p-sense amp 138. Likewise, n-type isolation/equilibrate transistor 134 is connected between node 137 of the sense amps and the digit line 124. N-type equilibrate transistor 139 is provided to equalize nodes 135 and 137 of the sense amps to a common voltage. As described below, this common voltage is preferably near Vcc/2.

Referring to FIG. 4, to sense data stored on a memory cell 126 the digit line 124 and nodes 135 and 137 of the sense amps are equalized by activating the gate of transistor 139 (EQ). Transistor 134 is then turned off by lowering its gate voltage (ISO Equil). Prior to sensing stored data, the equilibrate transistor 139 is turned off. The voltage at node 137 is coupled down when transistor 139 is turned off. For example, the voltage on node 137 drops by approximately 20 mv when transistor 139 is turned off. Node 135, however, remains relatively unchanged because the large capacitance on digit line 124 resists the coupling effect of transistor 139 and maintains a relatively stable voltage. It will be understood, therefore, that a small differential voltage is immediately imparted between the sense amp nodes 135 and 137 when transistor 139 is turned off. Because the typical differential resulting from data stored on a memory cell is approximately 100 mv, a differential of 20 mv resulting from coupling is significant and must be addressed, as explained below.

Node 137 is latched to the equilibrate voltage, less the coupling effect. One of the access transistors 128(0)–(n) is selectively activated by raising the corresponding word line 130(0)–(n). The charge, or lack of charge, stored in the memory cell is shared with the digit line and sense amp node 135. The change in the voltage on the digit line is dependent upon the charge stored in the memory cell, typically this voltage differential, as stated above, is approximately ±100 mv.

After the charge has been coupled to the digit line, isolation transistor 132 is turned off by lowering its gate voltage (ISO Digit) to isolate node 135 from the selected digit line. By isolating node 135 from the digit line 124, the capacitance of digit line 124 is eliminated and node 135 will be coupled down by the same amount that node 137 was coupled down. The total differential between sense amp nodes 135 and 137 is equal, therefore, to the charge stored upon the selected memory cell.

The sense amps are then strobed using NLat and PLat to drive node 135 to the appropriate supply level, as known to one skilled in the art. That is, if node 135 is above the equilibrate level, the node is driven to Vcc and if node 135 is below the equilibrate level it is driven to ground. Isolation transistor 132 is then re-activated by raising ISO Digit so that the entire digit line 124 can go to the appropriate power rail and the memory cell can be refreshed. After word line 130 returns to a low level, the equilibrate transistor can be re-activated to insure that both nodes of the sense amps and the digit line are equalized.

Connecting nodes 135 and 137 through transistor 139 while the sense amps are activated will result in a crossing current in the sense amps. This crossing current can be relatively large and economically undesirable. It will be understood that when one sense amp node is originally at Vcc and the other is at ground, the resulting equilibrate level will be near Vcc/2.

Alternatively, transistor 134 can be used to selectively connect node 137 to the digit line 124 to equilibrate the sense amps by forcing node 137 to an opposite state. That is, by first isolating node 135 from the digit line 124 and then activating transistor 134, the sense amps will force the voltage on the digit line to change its state. If, for example, the digit line is a "one" when transistor 134 is activated, the voltage on the digit line will be forced to transition low by the n-sense amp. It will be understood that by holding node 135 constant and using transistor 134, crossing currents are avoided. A trigger or tracking circuit (not shown) can be used to latch the voltage at a level near Vcc/2. One embodiment would be to use a timing circuit to turn on equilibrate transistor 139 and turn off sense amps 136 and 138.

FIG. 5 illustrates the timing of this alternate equilibrate circuit. Equilibrate transistor 139 is turned off by lowering its gate voltage (EQ). Transistor 134 is turned off by lowering its gate, ISO Equil. A word line 130 is raised to access a memory cell 126 and transistor 132 is de-activated by lowering its gate voltage (ISO Digit). The sense amps are strobed using NLat and PLat, and transistor 132 is re-activated to refresh the memory cell. After the word line has returned low, transistor 132 is turned off to isolate digit line 124 from node 135. Transistor 134 is activated by raising its gate voltage (ISO Equil) and node 137 is connected to the digit line. The sense amps will force the digit line to begin to change states by either charging or discharging the digit line. When the voltage on the digit line is approximately Vcc/2 a timing or trigger circuit will activate equilibrate transistor 139 and turn off the sense amps. Both nodes 135 and 137 are therefore equalized and transistors 132 is activated. Finally, transistor 134 is turned off.

An optional bias circuit 141 is shown in FIG. 3. This circuit can be used to bias the digit line 142 to a predetermined voltage level. By activating transistors 132 and 139 the nodes of the sense amps could be equilibrated to the pre-determined voltage level. This equilibrate option requires additional die area and is therefore economically less desirable then the other equilibrate circuits.

FIG. 6 is a more detailed diagram of a sensing operation on a selected memory cell which contains data stored as a "one" in the circuit of FIG. 3. It can be seen that prior to the gate of transistor 139 (EQ) falling from Vcc (3.6 volts) the sense amp nodes 135 and 137 are equalized at 1.8 volts (Vcc/2). Node 137 is coupled low when EQ goes low, thereby, creating a small differential between nodes 135 and 137. One of the memory cells 126 is selected by raising its associated word line 130. The charge stored on the memory cell is shared with the digit line and node 135. The capacitance of the digit line 124 is higher than the capacitance of the memory cell, thus the voltage of node 135 only increases by a fraction of the drop in voltage on the memory cell. Transistor 132 is turned off by lowering the ISO Digit line. As a result, node 135 is coupled low and the differential voltage between the sense amp nodes reflects a true value of the memory cell charge. After the sense amps are electrically isolated from the digit line, the n-sense amp 136 is strobed (shown as point N) and then the p-sense amp 138 is strobed (shown as point P). Note that node 135 is coupled low after the n-sense amp is strobed, but is pulled high when the p-sense amp is strobed. Transistor 132 is re-activated to connect node 135 to the digit line and memory cell 126. Both nodes of the sense amps are coupled high when the ISO Digit line goes high. Node 135 is pulled high by the p-sense amp and node 137 is pulled low by the n-sense amp. The memory cell is refreshed during the time that both transistor 132 and transistor 130 are activated. That is, the voltage on memory cell 126 is pulled to Vcc to re-charge the cell. It will be recognized that the gate voltages on transistors 132 and 130 are connected to a pump voltage which has a high level above Vcc, as known to one skilled in the art. The EQ line returns high to activate transistor 139 and nodes 135 and 137 are equilibrated to Vcc/2.

Figure 7:
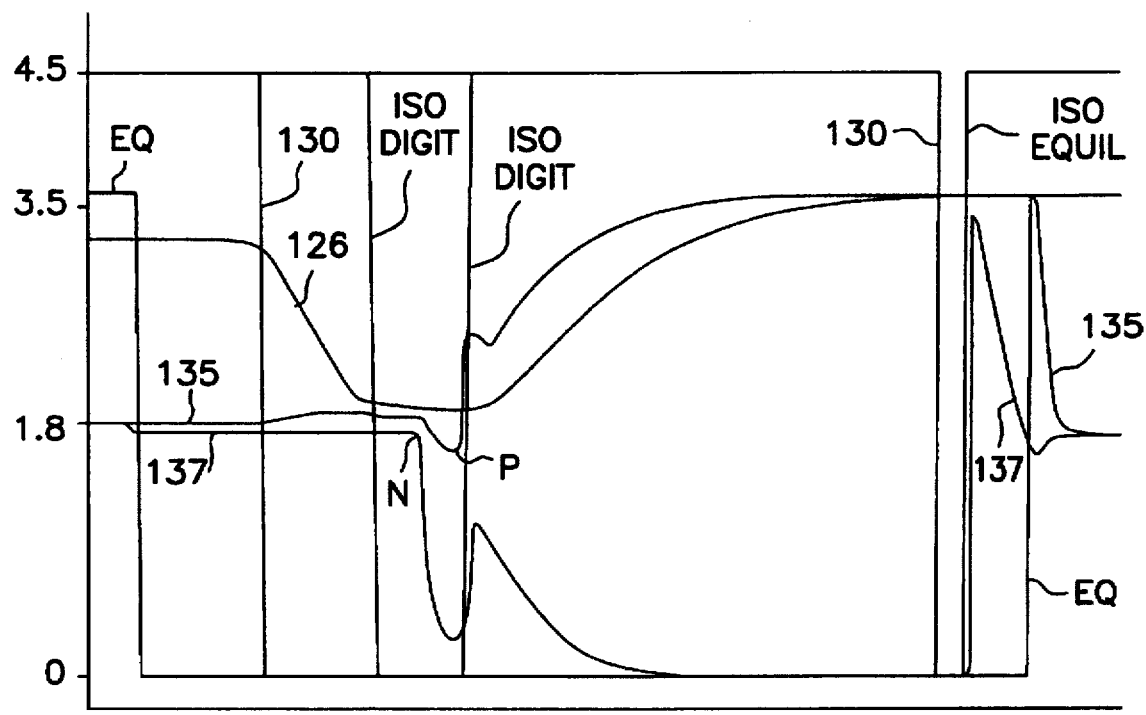
FIG. 7 is a detailed diagram of an alternate equilibration operation.

FIG. 7 is similar to FIG. 6, however, the sense amp nodes 135 and 137 are equilibrated using transistor 134. After the nodes have been driven to full rails by the sense amps, ISO Equil is raised to activate transistor 134. Node 137 is, therefore, initially coupled high and then begins to return low as the charge on the digit line is discharged. When the voltage level on node 137 is approximately Vcc/2 transistor 139 is activated and the sense amps are turned off to equilibrate nodes 135 and 137. The equilibrate voltage level can vary, provided the level remains approximately equal to the bias level of NLat and PLat.

Figure 8:
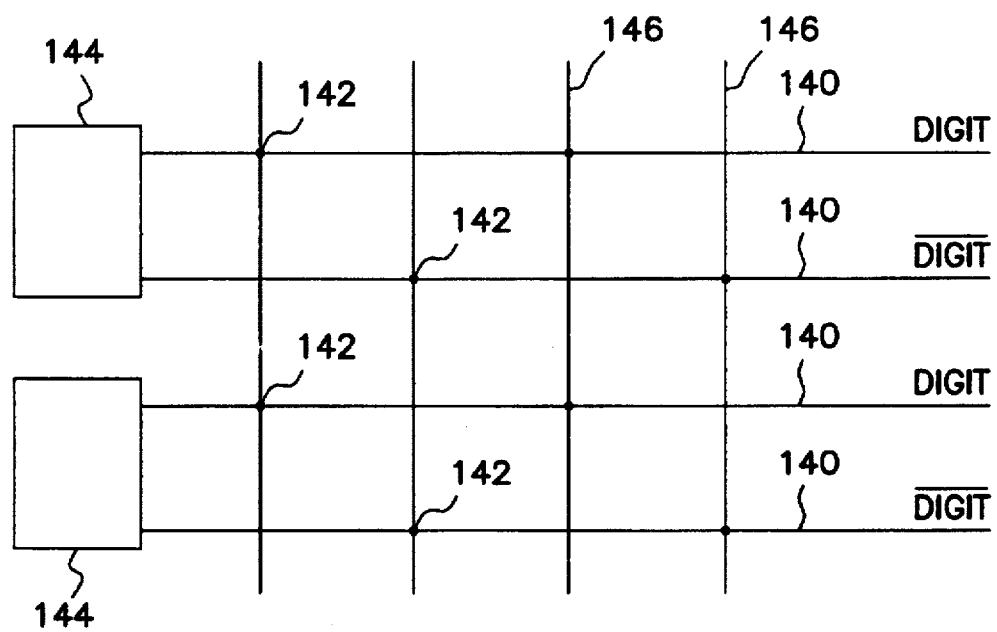
FIG. 8 is a simplified layout of a related memory circuit.
Figure 9:
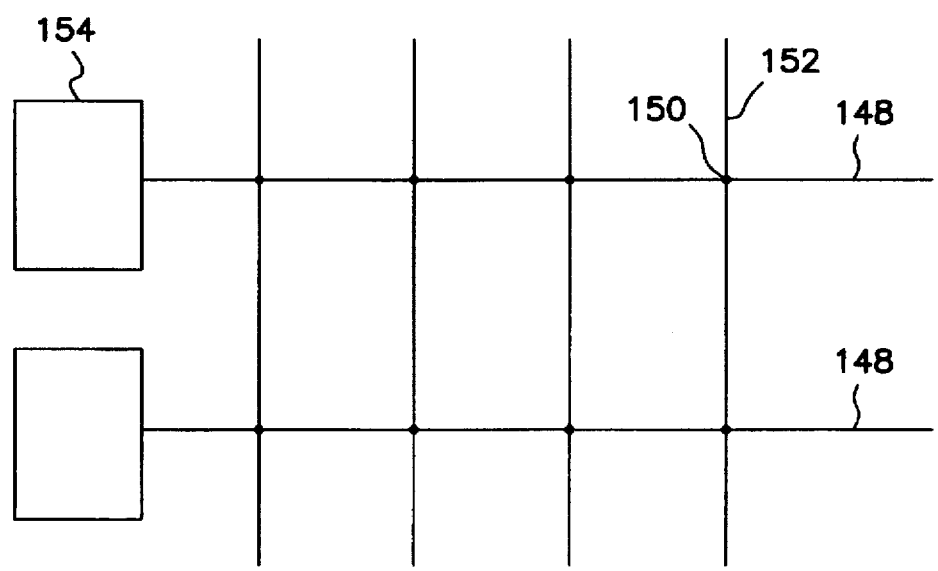
FIG. 9 is a simplified layout of a memory circuit incorporating the present invention.

By using a single-ended sensing circuit, the number of digit lines needed for a given amount of memory can be reduced. Further the spacing needed to connect the memory cells to the digit lines is reduced, thereby allowing for the compression of memory cells. Referring to FIG. 8, the related integrated circuit uses two digit lines 140 to connect memory cells 142 to each sense amp 144. The memory cells are arranged such that the intersection of every-other row line 146 and every-other digit line have a memory cell 142. Each sense amp 144 can, therefore, selectively sense four different memory cells in this illustration. It can be seen that any reductions in memory cell size cannot be fully realized do to the layout spacing requirements. In contrast, FIG. 9 illustrates an integrated circuit incorporating the cell plate biasing of the present invention. Memory cells 150 are located at each intersection of digit lines 148 and row lines 152. Sense amp circuits 154 are biased using the single-ended circuit, as detailed above, and can selectively sense four different memory cells in this illustration.

By eliminating the second digit line, the spacing of the memory cells can be greatly reduced. The present invention allows the use $6F^2$ size memory cells where the conventional circuit used $8F^2$ memory cells, where F is the device feature size as known by one skilled in the art.

CONCLUSION

An integrated circuit dynamic memory which requires less digit lines has been described. The integrated circuit uses one digit line in place of two digit lines for sensing charges stored on memory cell capacitors. The elimination of one digit line allows the miniaturization of memory cells and associated circuits to be fully exploited. Further, several circuits and methods have been presented for equilibrating the single-ended sense amplifiers prior to sensing data stored in a memory cell.

What is claimed is:

1. A memory device comprising:
    a plurality of memory cell capacitors having a first plate and a common second plate;
    a single digit line;
    a plurality of access transistors, each access transistor connected between one of the plurality of memory cell capacitors and the single digit line;
    a differential sense amplifier having first and second nodes;
    a first isolation transistor electrically located between the first node of the differential sense amplifier and the single digit line for selectively isolating the first node from the single digit line in response to a first isolation transistor gate voltage;
    a second isolation transistor electrically located between the second node of the differential sense amplifier and the single digit line for selectively isolating the second node from the single digit line in response to a second isolation transistor gate voltage;
    an equilibration circuit connected to the first and second nodes of the differential sense amplifier.

2. The memory device of claim 1 wherein the first and second isolation transistors are n-channel transistors.

3. The memory device of claim 1 further comprising a bias circuit coupled to the single digit line for charging the single digit line to a predetermined bias voltage level.

4. The memory device of claim 3 wherein the predetermined bias voltage level is one-half a supply voltage (Vcc).

5. The memory device of claim 1 wherein the common second plate is coupled to a bias voltage of one-half a supply voltage (Vcc).

6. The memory device of claim 1 wherein the plurality of memory cell capacitors are fabricated as $6F^2$ memory cells.

7. A random access memory device comprising:
    a plurality of memory cell capacitors having a first plate and a common second plate;
    a single digit line fabricated as a layer of metal;
    a plurality of access transistors, each access transistor connected between the first plate of one of the plurality of memory cell capacitors and the single digit line;
    a differential sense amplifier having first and second nodes, the differential sense amplifier comprising a pair of n-channel transistors, and a pair of p-channel transistors;
    a first n-channel isolation transistor electrically located between the first node of the differential sense amplifier and the single digit line for electrically isolating the first node from the single digit line in response to a first isolation transistor gate voltage;
    a second n-channel isolation transistor electrically located between the second node of the differential sense amplifier and the single digit line for electrically isolating the second node from the single digit line in response to a second isolation transistor gate voltage;
    an n-channel equilibration transistor connected to the first and second nodes of the differential sense amplifier.

8. The random access memory device of claim 7 wherein the plurality of memory cell capacitors are fabricated as $6F^2$ memory cells.

9. A method of operating a memory device having a single digit line coupled between a sense amplifier and a memory cell, the method comprising the steps of:
    electrically coupling first and second nodes of the sense amplifier with the single digit line;
    activating an equilibrate circuit to equilibrate the first and second nodes of the sense amplifier, and the single digit line to a predetermined voltage;
    deactivate the equilibrate circuit;
    electrically isolating the first node of the sense amplifier from the single digit line;
    electrically coupling the memory cell to the single digit line and charge sharing a charge stored on the memory cell with the single digit line;
    electrically isolating the second node of the sense amplifier from the single digit line; and
    sensing a differential voltage between the first and second nodes of the sense amplifier.

10. The method of claim 9 wherein the step of electrically coupling the memory cell comprises:
    activating an access transistor connected to the memory cell and the single digit line.

11. A method of equilibrating a memory device having a single digit line coupled between a sense amplifier and a memory cell, the method comprising the steps of:
    electrically coupling a second node of the sense amplifier with the single digit line;

deactivating an equilibrate circuit coupled between first and second nodes of the sense amplifier;

electrically isolating the first node of the sense amplifier from the single digit line;

electrically coupling the memory cell to the single digit line and charge sharing a charge stored on the memory cell with the single digit line;

electrically isolating the second node of the sense amplifier from the single digit line;

sensing a differential voltage between the first and second nodes of the sense amplifier, and electrically coupling the second node of the sense amplifier with the single digit line to refresh data stored in the memory cell;

decoupling the memory cell from the single digit line;

electrically isolating the second node of the sense amplifier from the single digit line after the memory cell has been decoupled;

electrically coupling the first node of the sense amplifier with the single digit line while the sense amplifier is active; and turning the sense amplifier off and electrically coupling the second node of the sense amplifier with the single digit line when the single digit line reaches a predetermined voltage level.

12. A method of equilibrating a memory device having a single digit line coupled between a sense amplifier and a memory cell, the method comprising the steps of:

electrically isolating the single digit line from a first node of the sense amplifier;

activate the sense amplifier to sense a charge provided on the single digit line via a second node of the sense amplifier;

electrically isolating the single digit line from the second node of the sense amplifier;

electrically coupling the first node to the single digit line while the sense amplifier is activated; and turning the sense amplifier off and electrically coupling the second node of the sense amplifier with the single digit line.

13. A method of equilibrating a memory device having a single digit line coupled between a sense amplifier and a memory cell, the method comprising the steps of:

electrically coupling a second node of the sense amplifier with the single digit line;

deactivating an equilibrate circuit coupled between first and second nodes of the sense amplifier;

electrically isolating the first node of the sense amplifier from the single digit line;

electrically coupling the memory cell to the single digit line and charge sharing a charge stored on the memory cell with the single digit line;

electrically isolating the second node of the sense amplifier from the single digit line;

sensing a differential voltage between the first and second nodes of the sense amplifier, and electrically coupling the second node of the sense amplifier with the single digit line to refresh data stored in the memory cell;

decoupling the memory cell from the single digit line;

electrically isolating the second node of the sense amplifier from the single digit line after the memory cell has been decoupled;

electrically coupling the first node of the sense amplifier with the single digit line while the sense amplifier is active; and turning the sense amplifier off and electrically coupling the second node of the sense amplifier with the single digit line after a predetermined time.

14. An integrated circuit comprising:

a plurality of $6F^2$ memory cell capacitors;

a plurality of access devices connected to the plurality of memory cell capacitors and a single digit line, each for selectively connecting one of the plurality of memory cell capacitors to the single digit line; and a differential sense amplifier circuit having first and second nodes each selectively connected to the single digit line through first and second isolation transistors, the first isolation transistor having a drain connected to the first node and a source connected to the digit single line, the second isolation transistor having a drain connected to the second node and a source connected to the single digit line.

15. A dynamic memory integrated circuit comprising:

a plurality of $6F^2$ memory cell capacitors;

a plurality of access devices connected to the plurality of memory cell capacitors and a single digit line, each for selectively connecting one of the plurality of memory cell capacitors to the single digit line;

a differential sense amplifier having first and second nodes;

a first isolation transistor electrically located between the first node of the differential sense amplifier and the single digit line for selectively isolating the first node from the single digit line in response to a gate voltage; and a second isolation transistor electrically located between the second node of the differential sense amplifier and the single digit line for selectively isolating the second node from the single digit line in response to a gate voltage.

* * * * *